United States Patent [19]
Ono et al.

[11] Patent Number: 5,606,198
[45] Date of Patent: Feb. 25, 1997

[54] SEMICONDUCTOR CHIP WITH ELECTRODES ON SIDE SURFACE

[75] Inventors: Yukichi Ono; Katsuhiko Ishida, both of Hamamatsu, Japan

[73] Assignee: Yamaha Corporation, Japan

[21] Appl. No.: 321,924

[22] Filed: Oct. 12, 1994

[30] Foreign Application Priority Data

Oct. 13, 1993 [JP] Japan .................................. 5-256170
Oct. 7, 1994 [JP] Japan .................................. 6-244465

[51] Int. Cl.[6] ........................ H01L 23/482; H01L 23/495
[52] U.S. Cl. ........................ 257/666; 257/737; 257/786; 361/764; 361/769; 361/774; 361/776
[58] Field of Search ........................ 257/784, 786, 257/737, 738, 690, 700, 666; 361/760, 761, 764, 769, 773, 774, 776

[56] References Cited

U.S. PATENT DOCUMENTS

| | | | |
|---|---|---|---|
| 4,465,898 | 8/1984 | Orcutt et al. ........................ | 361/412 |
| 4,495,376 | 1/1985 | Hightower et al. ........................ | 357/74 |
| 4,622,574 | 11/1986 | Garcia ........................ | 257/786 |
| 4,822,988 | 4/1989 | Gloton ........................ | 235/492 |
| 5,126,286 | 6/1992 | Chance ........................ | 437/203 |
| 5,266,833 | 11/1993 | Capps ........................ | 257/691 |
| 5,341,027 | 8/1994 | Park et al. ........................ | 257/668 |

FOREIGN PATENT DOCUMENTS

| | | | |
|---|---|---|---|
| 0241228 | 11/1985 | Japan ........................ | 257/738 |
| 0232342 | 9/1988 | Japan ........................ | 257/690 |
| 0319955 | 12/1989 | Japan ........................ | 257/784 |
| 0247632 | 9/1992 | Japan ........................ | 257/784 |

*Primary Examiner*—Peter Toby Brown
*Attorney, Agent, or Firm*—Ostrolenk, Faber, Gerb & Soffen, LLP

[57] ABSTRACT

A semiconductor device comprising a semiconductor chip substrate, an integrated circuit formed on a surface of the semiconductor chip substrate, and metal electrodes extending from the integrated circuit to at least one of the side surfaces of the semiconductor chip substrate. Occupation area on a wiring circuit board can be reduced. Damaged chips can be exchanged easily. When it is set vertically, heat radiation efficiency can be improved.

1 Claim, 10 Drawing Sheets

SEMICONDUCTOR CHIP WITH ELECTRODES ON SIDE SURFACE

BACKGROUND OF THE INVENTION a) Field of the Invention

The present invention relates to a semiconductor device adapted for a high density wiring, and more particularly to a semiconductor device having contact portions on a semiconductor chip for connecting directly with a circuit board.

b) Description of the Related Art

In general, a multiplicity of integrated circuits are simultaneously manufactured on a semiconductor wafer. When the manufacturing process is finished, the wafer is severed into semiconductor chips corresponding to respective integrated circuits (IC). Each of the semiconductor chips is accommodated in a package that generally is concurrently a container and a wiring board. Bonding pads on the chip are connected with leads of the package. The package is sealed after having been wire-bonded. When the package is made of plastics, the chip is mounted on a lead frame, wire bonded, and molded with plastics such as epoxy resin, or the like. A semiconductor package thus manufactured is mounted on a printed circuit board.

A package facilitates the following objects:
1. for protecting a semiconductor chip from environmental influence chemically, electrically, and mechanically;
2. for radiating heat generated from the semiconductor chip; and
3. for affording an easy connection with various circuit boards by expanding fine wiring pitch of the semiconductor chip.

FIG. 10 is a sectional view showing the packaged state of a semiconductor chip in a plastic package. As shown in the figure, a semiconductor chip 1 is mounted on a die of a lead frame 52 made of 42-alloy or the like. Electrodes or bonding pads of the semiconductor chip 1 and lead portions of the lead frame 52 are wire bonded by metal wires 53 made of Au or the like. The semiconductor chip 1, the lead frame 52, and the bonding wires 53 are molded and sealed by a resin 54 such as epoxy, polyimide, etc., and form an IC package PC. When a lead frame train including a multiplicity of connected units 52 is employed, mold sealing of a multiple of chips can be performed simultaneously. Thus, cost of production can be reduced. It is suitable for mass production.

Aside from the method of wiring an IC chip by packaging described above, there is another method for wiring a semiconductor chip in a bare state. FIG. 11 is a sectional view showing a semiconductor device connection by flip-chip bonding that is one of such methods. Flip-chip bonding is a kind of wireless bonding that bonds without using any metal wire 53. In FIG. 11, metal bumps 55 made of solder or the like are formed on electrode pads on a semiconductor chip 1. The bumps 55 are directly connected with patterned conductors 56 on a printed board PCB. In such method of connection, occupied area per unit IC is almost equal to dimensions of a semiconductor chip 1. Thus, miniaturization of the circuit board compared to connection with a packaged IC is attained.

In a semiconductor device as shown in FIG. 10, an area that a package PG occupies on a printed circuit board (PCB) becomes large, so that miniaturization and increasing wiring density of the circuit board is limited. In a circuit board using flip chip bonding, metal bumps 55 of a semiconductor chip 1 are connected by directly pressing to conductive patterns, so that the semiconductor chip 1, once connected, is not easily removed. Thus, when the semiconductor chip 1 is revealed to have a deflect, exchange off the IC chip is not easy.

SUMMARY OF THE INVENTION

An object of the present invention is to provide a semiconductor IC device that reduces occupied package area on a substrate, and is easy to be exchanged when the chip is found to have a defect.

According to one aspect of the present invention, there is provided a semiconductor chip comprising a semiconductor chip substrate, an integrated circuit formed on a surface of the semiconductor chip substrate, and electrode metal layers formed to extend from electrode portions of the integrated circuit to at least one side surface of the semiconductor chip substrate.

According to this configuration, a semiconductor chip can be connected at a side surface or surfaces of the chip directly to patterned conductive members on a printed circuit board, so that an occupied area of a semiconductor chip on the circuit board can be reduced. Further, the region of connection of a semiconductor chip with the printed circuit board is limited to a region of a narrow width, and hence the semiconductor chip can be easily exchanged.

Thus, since an integrated circuit formed on a surface of a semiconductor chip is connected with electrodes on a side surface or surfaces of the semiconductor chip, occupied area on a circuit board can be reduced, and at the same time, exchange of a chip having a defect can be easily performed.

DESCRIPTION OF THE PREFERRED EMBODIMENTS

Figure 1:
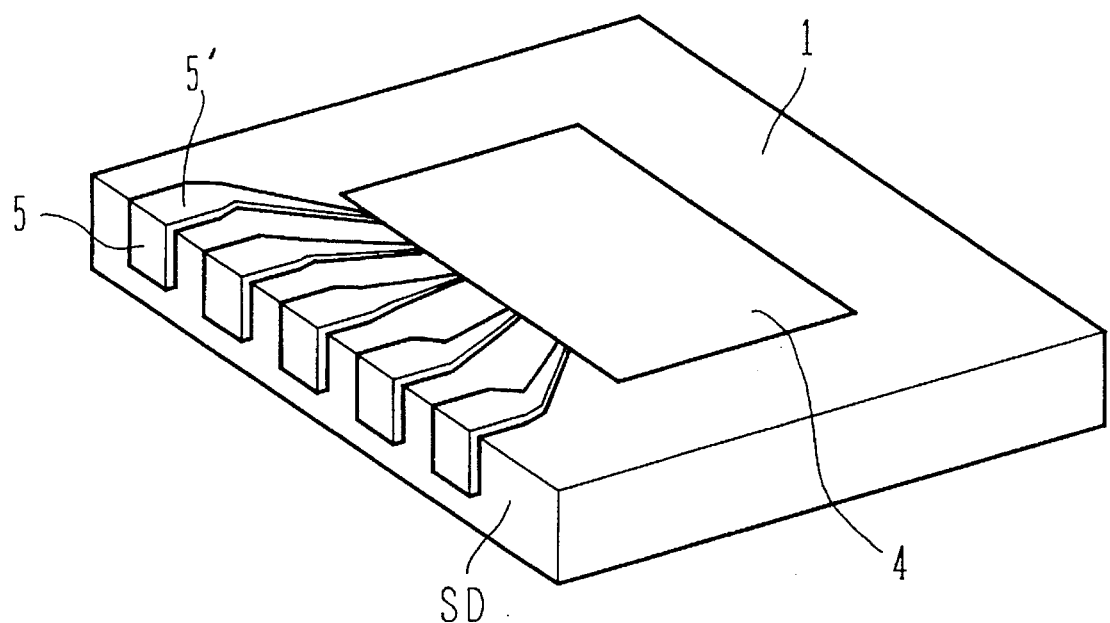
FIG. 1 is a perspective view showing a configuration of a semiconductor chip according to an embodiment of the present invention.

An embodiment of the present invention will be described hereunder referring to the figures. FIG. 1 is a schematic perspective view showing a configuration of a semiconductor chip according to an embodiment of the present invention. An integrated circuit 4 is formed on an upper surface of the substrate of the semiconductor chip 1. Side surface electrodes 5 are connected via wirings 5' on the upper surface of the chip 1 to electrode portions (not shown in the figure) within the integrated circuit 4. Material of the side surface electrodes, at least the uppermost layer thereof, is selected according to how the electrodes are to be connected. For example, for soldering connection, the electrodes are preferably formed of a Cu layer having a surface finished with Ni or Au.

Figure 2A:
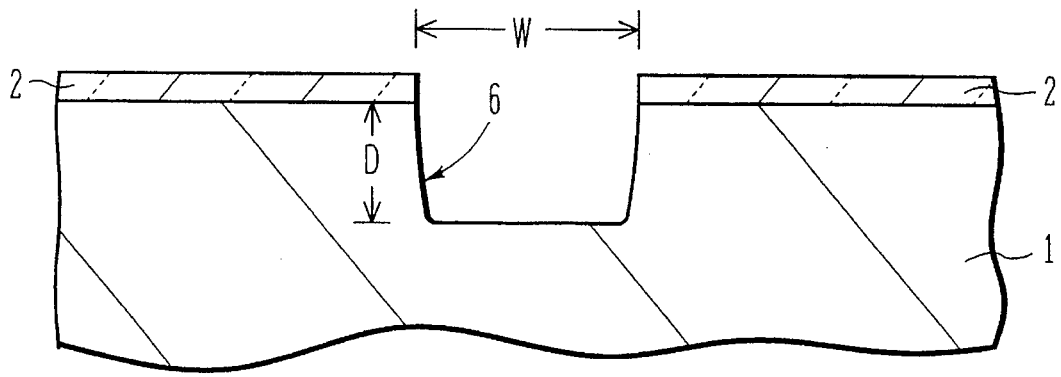
FIGS. 2A to 2C are sectional views illustrating main steps of manufacturing electrode metal members on a side surface of a semiconductor chip substrate according to an embodiment of the present invention.
Figure 2B:
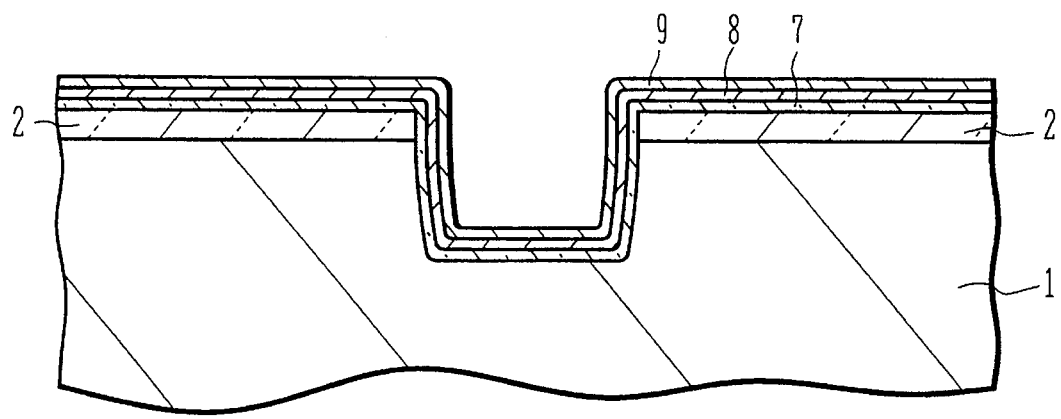
Figure 2C:
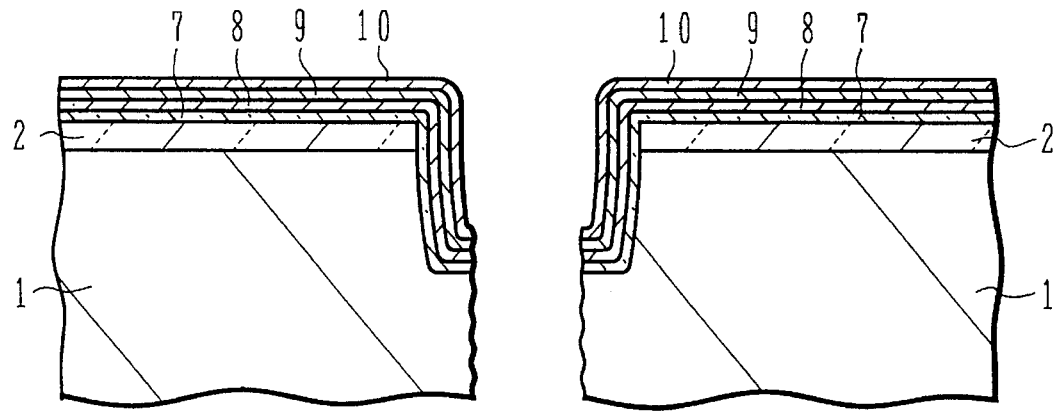

FIGS. 2A to 2C show a simple method of forming an electrode on a side surface of a semiconductor chip. Although a slightly wider space than the wirings in the inner circuit is necessary for the side surface electrodes, a space of approximately 150 to 200 μm practically causes no problem.

As shown in FIG. 2A, a groove 6 with a predetermined depth D is formed along a scribe line between substrates of the semiconductor chips 1, 1 . . . by a mechanical dicing machine, and by a wet, or a dry etch. An oxide film 2 covers the surface of a substrate, and serves as an etch mask. For example, after forming a groove with a depth D of 200 μm by a dicing machine, the surface of the groove is flattened by wet etch or by isotropic dry etch. A width of the groove is denoted by W.

As shown in FIG. 2B, an insulating layer 7 made of an oxide film, a nitride film, etc., is formed by chemical vapor deposition (CVD) for covering the surface of the groove. Then, an Al layer 8 and a Ni layer 9 are deposited by vapor deposition for forming surface wirings and side surface electrodes on the chip substrate. For the purpose of forming the layers uniformly also on the side surface, it is preferable to choose such a method or a vapor deposition equipment that has a least directional dependence and can form layers isotropically.

When the groove has a large depth, it is preferable to set an aperture ratio D/W to be less than 1 by broadening a width of the groove. For example, when a depth D is 200 μm, a groove width W is chosen to be 200 to 300 μm. By using a known technique of photolithography, the Al layer 8 and the Ni layer 9 are removed by etching, while leaving portions necessary for wiring on the surface of the chip substrate (namely, portions of the wiring 5' that connect the IC circuit part 4 with the side surface electrodes 5 as shown in FIG. 1) and with portions for forming side surface electrodes. Here, the Ni layer 9 is deposited on the Al layer 8. Alternatively, a Ni layer 9 can be deposited after depositing and patterning only an Al layer 8.

Next, a Cu layer 10 is formed with a predetermined thickness by non-electrolytic plating on the Ni layer 9 on wiring portions and side surface electrodes. Cu layer 10 may be formed thickly only on portions of side surface electrodes by covering the wiring portions on the substrate of the chip with a resist film. Further, when necessary, an Au layer may be plated on the Cu layer 10. It allows an easy electrical connection between the semiconductor chip and the printed circuit board.

As shown in FIG. 2C, the semiconductor chip 1 can be separated by dicing the groove from the bottom of the groove 6 or from the back side of the wafer. FIG. 2C shows sectional view of edge portions of the severed chips 1.

In the above-described process, when side surfaces of the groove 6 are approximately vertical, an exposing apparatus having a large depth of focus and a low directivity of irradiating light is necessary for of removing the Al layer 8 and the Ni layer 9 on the side surfaces of the groove by photolithography. But, providing an inclination to the side surface of the groove 6, no such special exposing apparatus is necessary. The Al layer 8 and the Ni layer 9 can be formed by normal sputtering apparatus.

There is no need of a small aperture ratio (no need of broadening groove width), too. A side surface electrode with a length of 200 μm and a width of 100 to 150 μm can be formed with a spacing (gap) of 100 to 150 μm.

For forming an inclination on the side surface of the groove 6, a predetermined slant angle may be afforded to a blade of a dicing machine for forming a diverging groove. A side surface having an inclination corresponding to the angle of the blade is obtained.

Figure 3:
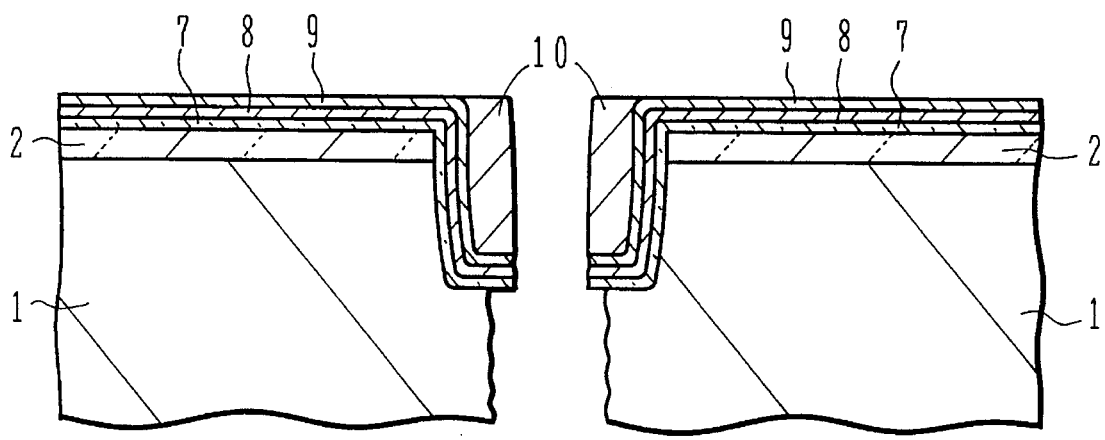
FIG. 3 is a sectional view showing another configuration of severing a semiconductor wafer into chips.

FIG. 3 is an example of a slanted side surface formed by the method described above. Before plating Cu, A groove is cut using a dicing machine having a thinner blade thickness than a width W of the groove. The Al layer 8 and the Ni layer 9 at the central part of the bottom of groove is removed. Then the surface of the chip substrate is covered with a resist. A Cu layer is plated only on the Ni layer on the surface of the groove. Then, the chip is severed carefully not to damage the side surface electrodes by using a dicing machine and silicon etching from the reverse surface of the wafer. FIG. 3 shows the side surface electrode portion when severed.

Figure 4A:
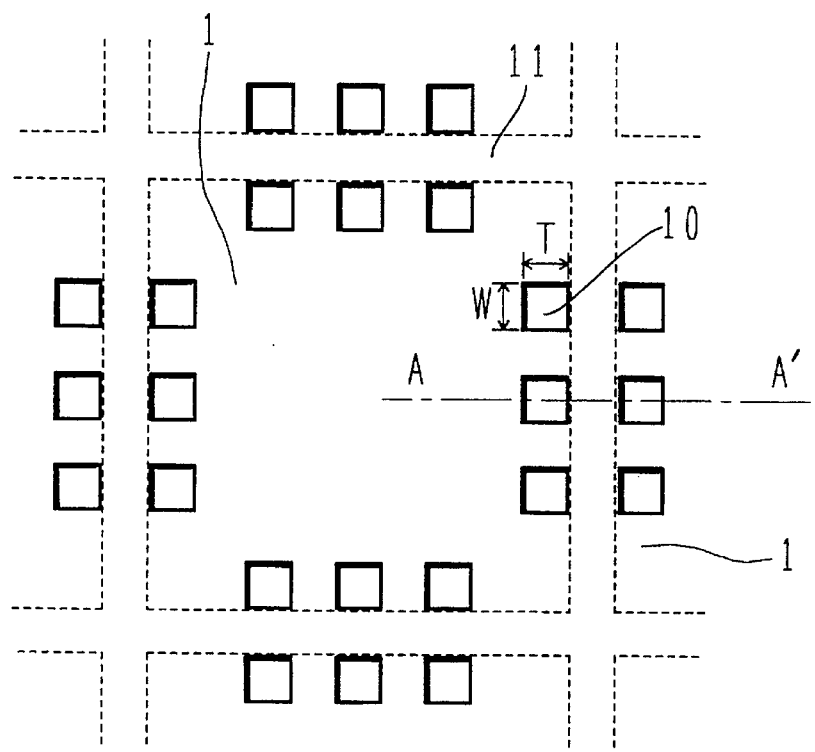
FIGS. 4A to 4E are sectional views illustrating main steps of manufacturing electrode metal members on side surfaces of a semiconductor chip substrate according to another embodiment of the present invention.

In FIGS. 4A to 4E, another method of forming side surface electrodes is shown. In FIG. 4A, the surface of each substrate of the semiconductor chips 1 for forming an integrated circuit is covered with an insulating layer 2 (see FIG. 4B). On the periphery of each substrate, holes 10 having dimensions (width W×thickness T×length L) approximately similar to side surface electrodes are formed by etching at positions on a surface of the silicon substrate to form the side surface electrodes. The holes 10 are shown to be oppositely facing to each other across the scribe lines 11. The holes 10 are dry etched to a predetermined depth, and are, then, wet etched to form slant surface at each side surface.

Figure 4B:
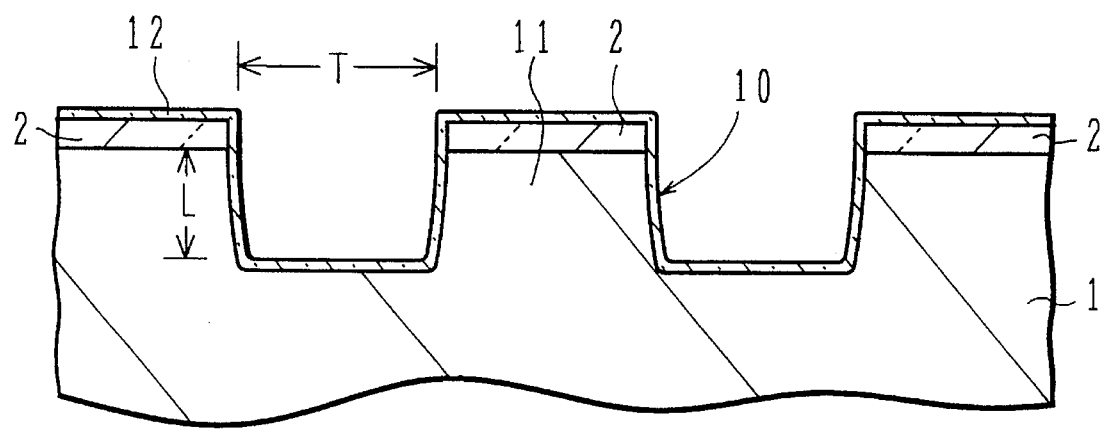

In FIG. 4B, an enlarged sectional view of hole portions 10 is shown. Space between a pair of holes 10 corresponds to a scribe line. After forming the holes 10 by etching, an insulating layer 12 is formed on the surface of the holes by thermal oxidation or CVD.

Figure 4C:
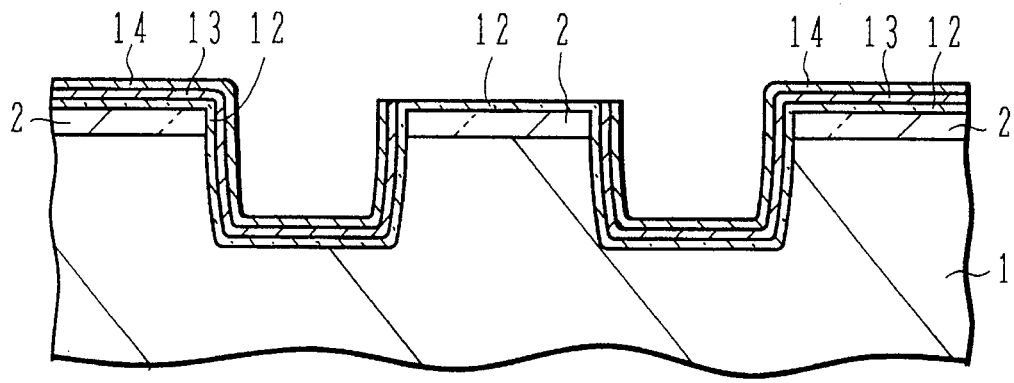

Then, as shown in FIG. 4C, an Al layer 13, and a Ni layer 14 are deposited on the insulating layer 12 by vapor deposition or sputtering. Using photolithography, portions of the Al layer 13 and the Ni layer 14 are removed by etching, leaving wiring portions 5' and bonding portions 5 on the hole portions 3 on the surface of the substrate of the semiconductor chip 1.

Figure 4D:
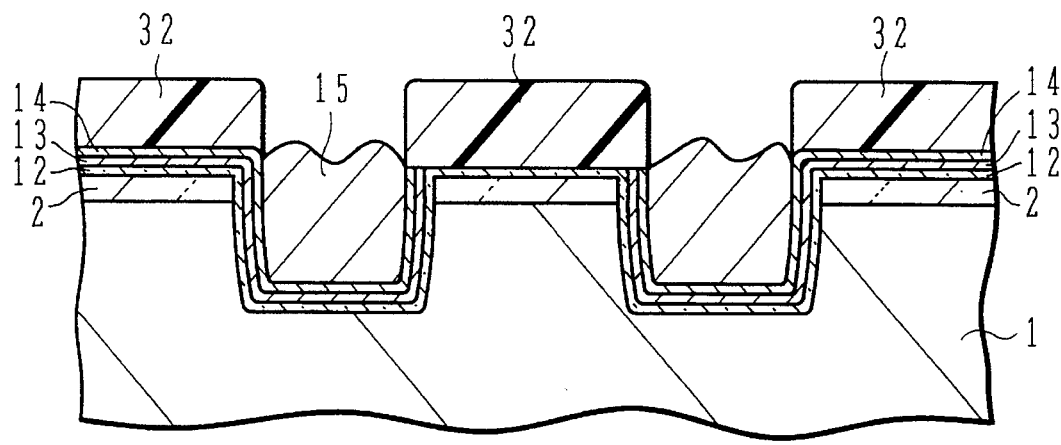

Then, as shown in FIG. 4D, the surface of the substrate of the chip is coated by a resist film 32. The Ni layer 14 on the holes 3 are exposed. Cu layers 15 are plated thereon. Thickness of the plated Cu layers 15 is chosen so that the holes are filled with Cu to form an approximately the same plane with the surface of the silicon substrate and to form a flat surface.

Figure 4E:
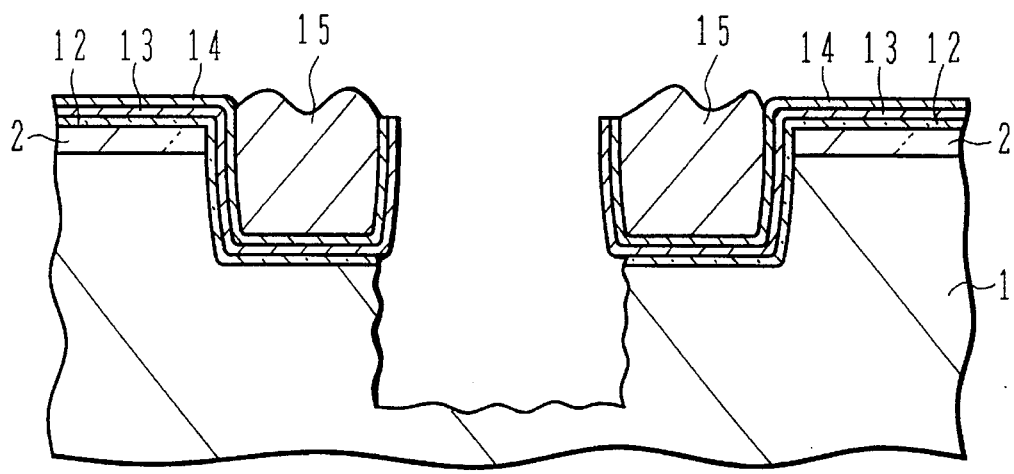

Further, as shown in FIG. 4E, portions between associated pairs of holes are cut along the scribe line to a predetermined depth (deeper than the hole 3) using a dicing machine for forming a groove. Then, the insulating layer 12 is exposed by wet etching of silicon. The insulating layer 12 is then removed by dry etching or by isotropic etching with a wet etchant.

As described above, side surface electrodes can be formed by first forming holes at positions on the substrate surface to form side surface electrodes on the silicon substrate and then filling the holes by a metal material. The metal material 15 serves as a reinforcement of side electrode layers 12 and 14. Also, the metal material 15 assures electrical contact off the side electrode layers 13 and 14. When a refractory metal such as W, etc. or a silicide such as WSi is used, the process of forming side surface electrodes may be performed simultaneously with process of forming LSI.

Figure 5A:
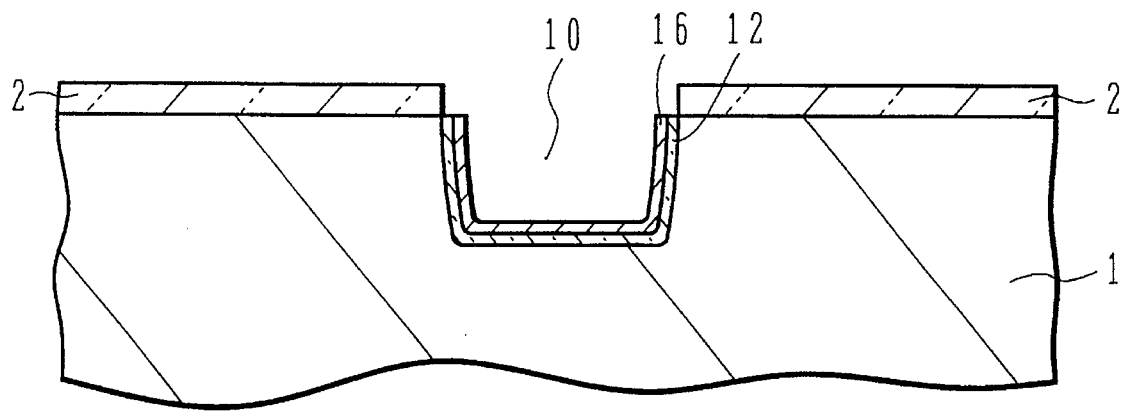
FIGS. 5A and 5B are sectional views illustrating main steps of manufacturing electrode metal members on a side surface of a semiconductor chip substrate according to another embodiment of the present invention.
Figure 5B:
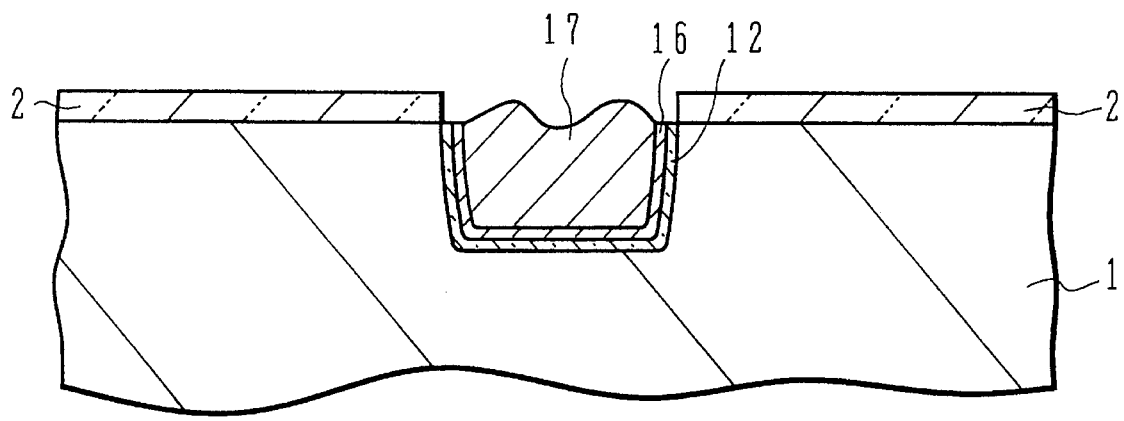

FIG. 5 shows an embodiment where grooves are filled with tungsten using selective CVD. A hole 10 is etched. The surface of the hole 10 is thermally oxidized to form an oxide layer 12. Then, a polysilicon layer 16 is deposited using CVD. Next, the polysilicon layer on a surface of the chip is removed by etching, leaving the polysilicon layer only on the surface portion of the hole 10. Tungsten CVD is performed with selected conditions to deposit W only on the polysilicon layer. Thus, the hole 10 is filled with tungsten region 17.

Methods of filling holes by deposition have been described above. Alternatively, silver paste, or other liquidized conductive material may be flown into the holes and solidified.

Figure 6A:
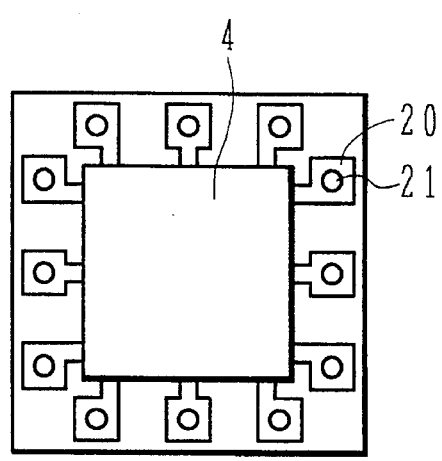
FIGS. 6A to 6D are plane and sectional views illustrating main steps of manufacturing electrode metal members on side surfaces of a semiconductor chip substrate according to another embodiment of the present invention.
Figure 6B:
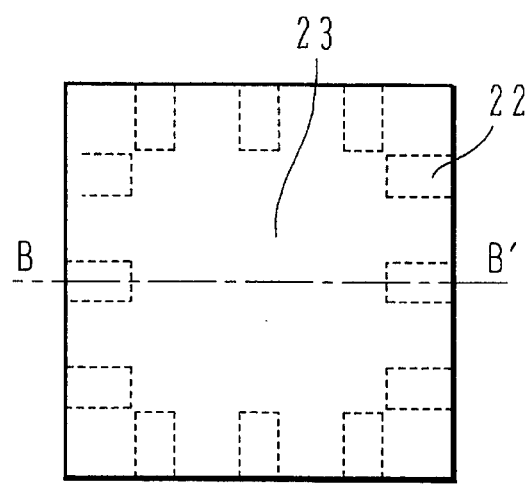
Figure 6C:
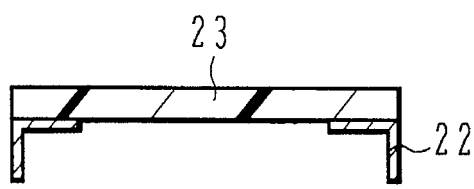
Figure 6D:
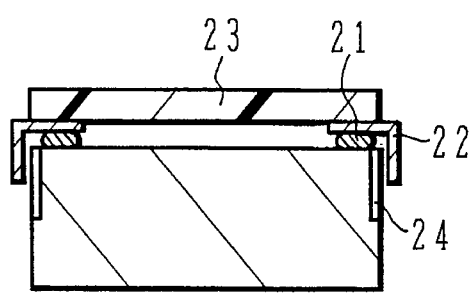

In FIGS. 6A to 6D, another embodiment is shown. After forming an integrated circuit 4 on a substrate of a semiconductor chip 1, as shown in FIG. 2 A groove 6 with a depth of 200 to 250 μm is formed on a silicon substrate along each scribe line. An insulating layer 24 as shown in FIG. 6D is deposited by CVD for covering surfaces of the cut-off groove 6 by the insulating layer 24. Then, the insulating layer on electrodes 20 is removed by etching using photo-lithography for exposing the electrodes 20.

As shown in FIG. 6A, bumps 21 are formed by known technique on electrodes 20 connected with an integrated circuit 4 on a substrate of a semiconductor chip 1 via metal wirings. Each chips is separated from the wafer. Electrodes are formed on side surfaces of the substrate of a semiconductor chip 1 by employing a polyimide film 23 that is provided with L-shaped leads 22 as shown in FIGS. 6B and 6C. The L-shaped leads 22 are formed of Cu and plated with Cu, Au, or Sn, and disposed at positions aligned with the bumps 21 on the semiconductor chip 1. FIG. 6B shows a plan view of the polyimide film provided with L-shaped connectors. FIG. 6C shows a sectional view cut along a line B—B' in FIG. 6B.

The bumps 21 and the leads 22 are connected electrically and mechanically by positioning and thermo-compressing the bumps 21 and the leads 22 of the film 23 so that the vertical portions of the leads 22 are positioned on the side surfaces of the chip substrate. FIG. 6D shows the assembled state. Thus, electrodes that are disposed on the side surface of the semiconductor chip 1 are formed.

This method can provide the following merits. A semiconductor chip 1 is protected mechanically by a polyimide film 23. A space between the semiconductor chip 1 and the polyimide film 23 can be filled with resins such as epoxy resin or silicone resin. In such case, a semiconductor chip that is stable physically and chemically is protected well from environment, and has a high reliability.

Next, description will be given concerning connection between a semiconductor chip and a circuit board.

Figure 7A:
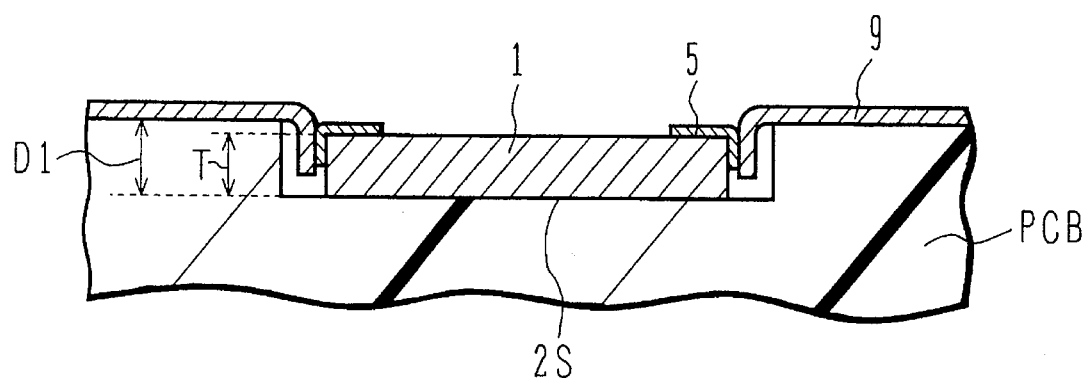
FIGS. 7A and 7B are a sectional view and a perspective view showing a state of wiring a semiconductor chip according to an embodiment of the present invention.
Figure 7B:
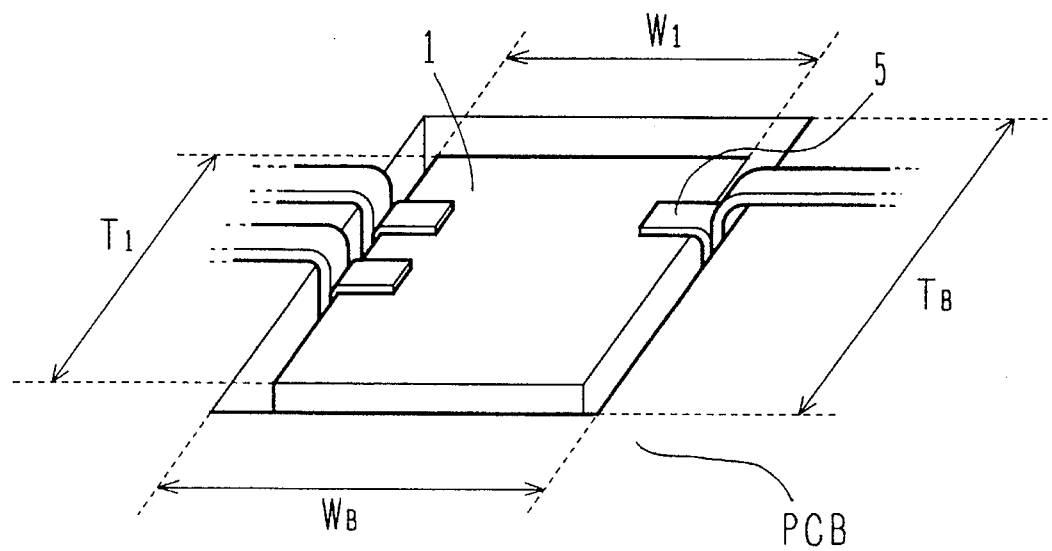

FIGS. 7A and 7B show an example of connecting a semiconductor device provided with metal electrodes 5, 5 . . . on opposing two of the four side surfaces SD to a printed circuit board. In FIGS. 7A and 7B, a recess or cavity 2S is formed on a printed circuit board PCB. Depth D1 of the cavity 2S is approximately equal to the thickness T of the semiconductor chip 1. Longitudinal length $T_B$ of the cavity 2S is slightly longer than longitudinal length T1 of the semiconductor chip 1. Transverse width $W_B$ of the cavity 2S is slightly longer than transverse width W1 of the semiconductor chip 1. Metal chips of electrodes 29, 29 . . . on the printed circuit board are formed to extend on the inner portion of the cavity 2S.

The semiconductor chip 1 is accommodated inside the cavity 2S, and the metal electrodes 5, 5 . . . on the semiconductor chip 1 are connected with the metal chips of electrodes 29, 29 . . . on the printed circuit board PCB. Soldering or spring contact may be employed for connection.

As described above, miniaturization of device becomes possible, since a semiconductor chip 1 in its bare state can be mounted directly on a printed circuit board PCB. A semiconductor chip 1 having a defect can be easily taken out from a cavity and can be exchanged.

Figure 8A:
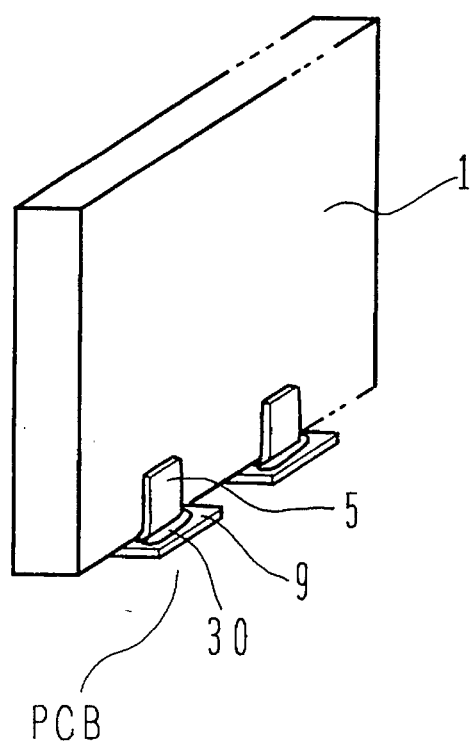
FIGS. 8A and 8B are a perspective view and a sectional view showing a state of wiring a semiconductor chip to a circuit board according to another embodiment of the present invention.
Figure 8B:
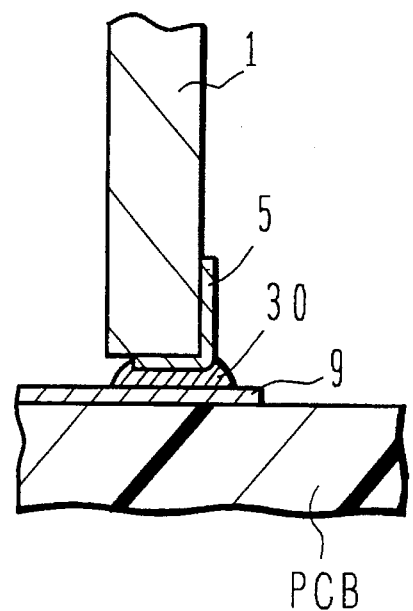

In an example of packaging as shown in FIGS. 8A and 8B, a semiconductor chip 1 formed with metal electrode layers 5, 5 . . . extending to side electrodes on one side surface SD is employed. In this example, the semiconductor chip 1 is set vertically on a printed circuit board PCB. The metal layers 5 are connected to a patterned conductors 29 on the printed circuit board PCB by soldering 30. By setting the semiconductor chip set straight vertically, occupied area on the PCB becomes smaller compared even with a packaging state shown in FIGS. 7A and 7B. Heat radiation efficiency of the semiconductor chip 1 may also improved by blowing the wind.

Figure 9:
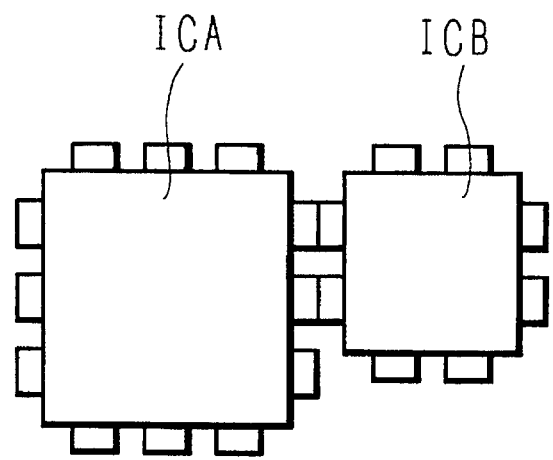
FIG. 9 is a schematic plan view showing another application of the semiconductor chips according to the embodiments of this invention.
Figure 10:
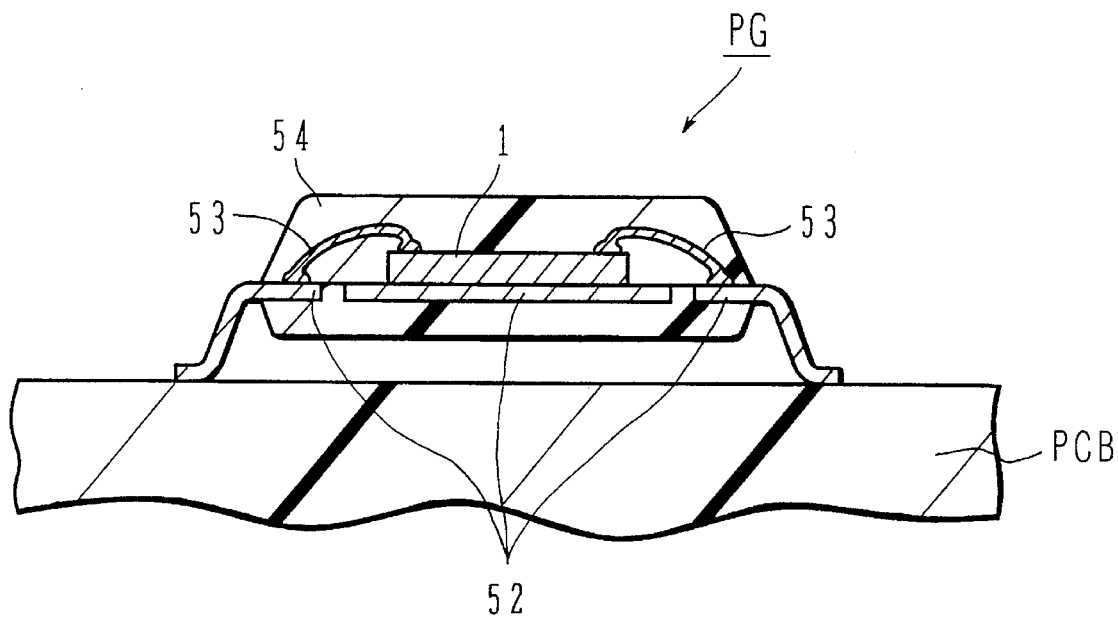
FIG. 10 is a sectional view showing a semiconductor device packaged by prior art technique.
Figure 11:
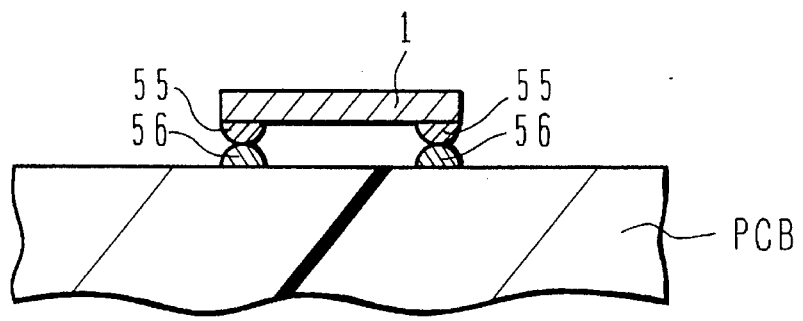
FIG. 11 is a sectional view showing a semiconductor device wired by flip-chip bonding of prior art technique.

In FIG. 9, another characteristic example of application of a semiconductor chip 1 having electrodes on side surfaces is shown. Two semiconductor integrated circuits ICA and ICB are directly connected via side surface electrodes.

Employing a uniform pitch for the side surface electrodes, the semiconductor chip ICA and the other semiconductor chip ICB can be connected directly by soldering, when the side surface electrodes of both chips are disposed facing to each other. Thus, a circuit function of a larger scale can be attained.

Examples of such connection are as follows:
1. Connection of digital LSI and analog LSI:
   Each type of LSI having different designing rule and manufacturing process can be manufactured with optimum rule and process adapted to each type. Then, they can be connected within a space of minimum area. Problem of noise will be reduced.
2. Increasing capacity of memory:
   A multiplicity of memory devices are connected according to necessary capacity of memory.
3. Direct connection of outer memory, etc. with LSI:
   External circuit or circuits are connected directly with an LSI chip.

The present invention has been described above along the preferred embodiments. The present invention is not limited thereto. It will be apparent to those skilled in the art that various changes, substitutions, combinations and improvements can be made within the scope and spirit of the appended claims.

I claim:

1. An electrode circuit device comprising:

a semiconductor chip comprising: a semiconductor substrate having a main surface and side surfaces; an integrated circuit formed on the main surface of said semiconductor substrate; and metal electrodes formed on the substrate and extending from said integrated circuit to corresponding recesses formed in at least one of the side surfaces of said semiconductor substrate; and a wiring circuit board having a cavity accommodating said semiconductor chip on the surface thereof and wirings extending into the cavity and contacting said electrodes, said cavity having a rectangular shape and said wirings including electrode leads on at least one side surface of the cavity, said metal electrodes being contacted to said electrode leads by spring force.

* * * * *